United States Patent [19]

Bush

[11] 4,327,530

[45] May 4, 1982

[54] ENCLOSURE FOR ELECTRONIC EQUIPMENT

[75] Inventor: Jeffrey L. Bush, Denville, N.J.

[73] Assignee: Bell Telephone Laboratories, Incorporated, Murray Hill, N.J.

[21] Appl. No.: 108,970

[22] Filed: Dec. 31, 1979

[51] Int. Cl.³ .............................................. E04B 1/346
[52] U.S. Cl. .......................................... 52/66; 52/67; 220/3.8; 292/60
[58] Field of Search ................. 52/66, 67, 72; 49/379; 220/3.8, 345, 346; 292/57, 60, 62; 312/284, 306, 100, 285

[56] References Cited

U.S. PATENT DOCUMENTS 2,792,794  5/1927  Miller ................................. 52/66 X
4,236,359 12/1980 Woolford ............................... 52/66

Primary Examiner—Carl D. Friedman
Attorney, Agent, or Firm—R. O. Nimtz

[57] ABSTRACT

A weatherproof enclosure for electronic equipment includes a base portion and a mushroom-shaped hood portion. When unlatched, the hood portion rises by spring action to permit full access to the electronic equipment mounted on the base portion. A moderate force on the hood, assisted by an internal counterweight, serves to return the hood to the latched position.

5 Claims, 8 Drawing Figures

FIG. 5
FIG. 6
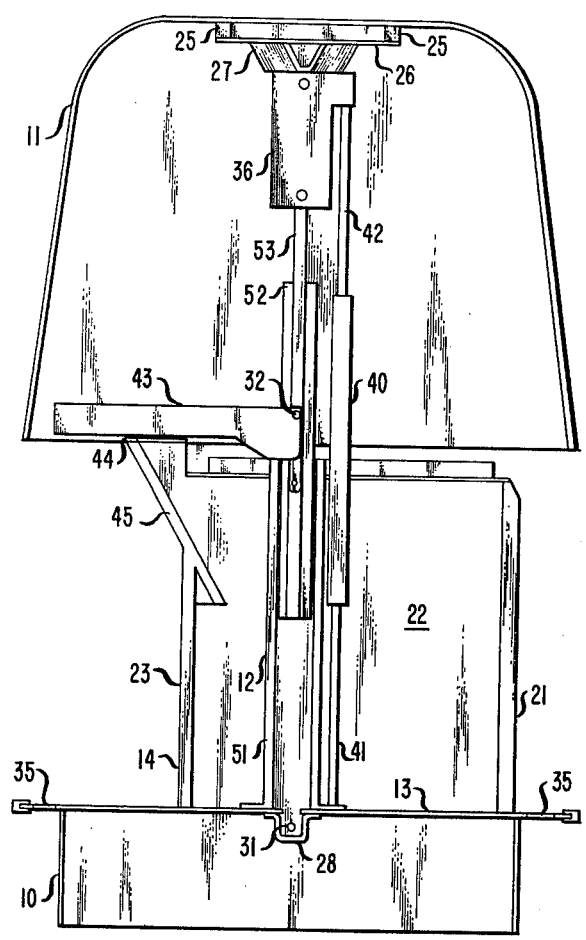
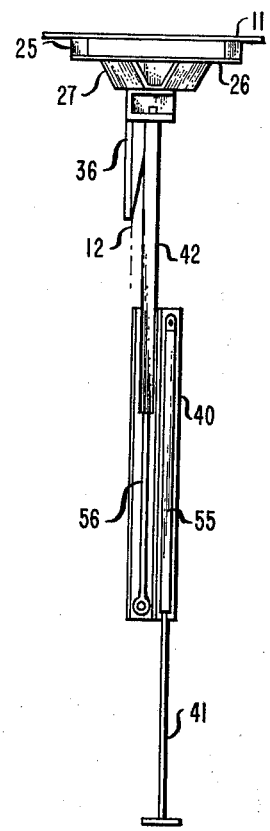

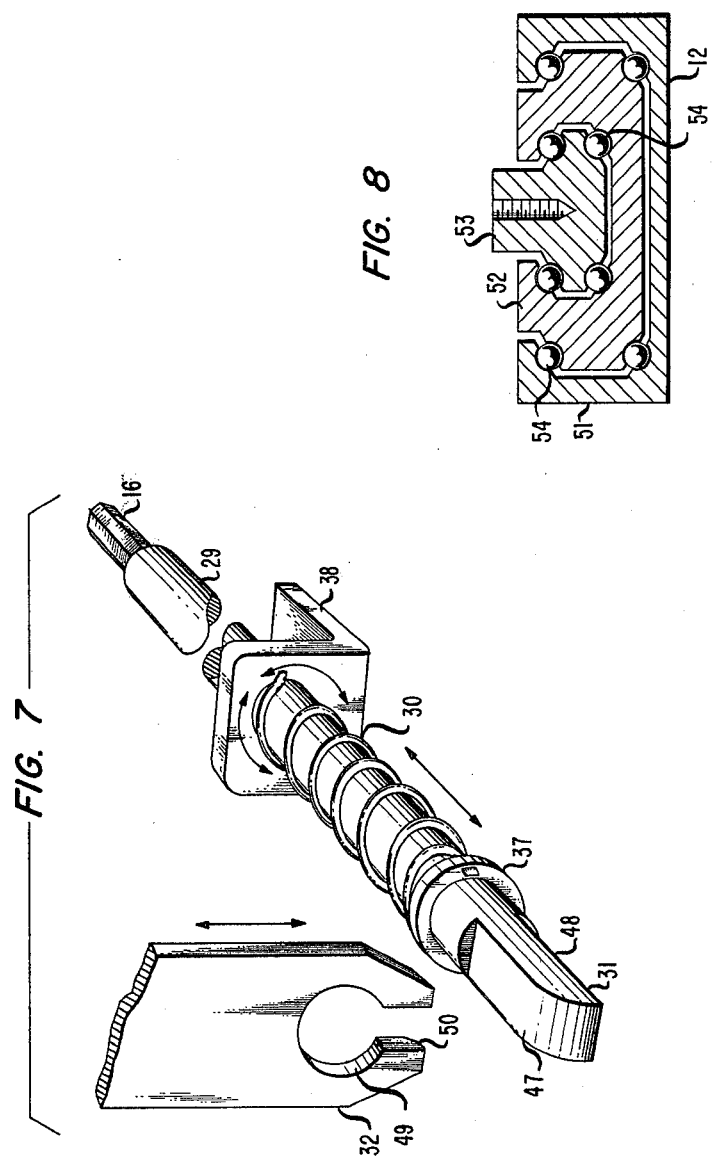

ENCLOSURE FOR ELECTRONIC EQUIPMENT

BACKGROUND OF THE INVENTION

1. Field of the Invention

This invention relates to weatherproof enclosures for electrical equipment and, more particularly, to easily accessible, automatically opening enclosures for outside plant telephone electronics.

2. Description of the Prior Art

It is becoming increasingly necessary to place electronic equipment in locations remote from the telephone central office in order to accommodate newly designed electronic carrier systems. One such system, in which digital carrier techniques are used to provide up to 96 telephone subscriber channels on two pairs of conductors, is disclosed in the copending application of S. J. Brolin et al., Ser. No. 97,699, filed Nov. 27, 1979. In such a system, one terminal of the carrier system is located at the central office. The other terminal, however, is located remotely from the central office in an area near to the subscriber group being served. In such a case, the remote terminal equipment must be housed in a weatherproof enclosure which is nonetheless easily accessible by service personnel attempting to service the terminal equipment.

Prior art enclosures for electronic gear have usually comprised cabinets mounted on telephone poles or on concrete slabs with hinged door access to the electronic equipment. Such arrangements, while suitable in many ways, require weatherproof seals for all access doors. Moreover, such cabinets are not always appealing from an aesthetic point of view.

A further problem with remotely located equipment cabinets is the desirability of being able to access the electronic equipment from all sides. That is, some service requests require access to a cross-connect field in order to change or add subscriber connections. Other service requests, however, require access to the electronic equipment itself, normally taking the form of printed circuit boards which must be inserted and removed. In effect, then, it would be desirable if access could be had to all sides of the electronic gear within the enclosure. A cabinet with doors is not easily amenable to such a requirement.

SUMMARY OF THE INVENTION

In accordance with the illustrative embodiment of the present invention, a weatherproof enclosure for electronic equipment is provided by means of a flat mounting plate having erected thereon a framework for attaching various electronic equipment. The framework and the electronic equipment are then enclosed by a mushroom-shaped hood which covers the frame and the electronic equipment and seals to a gasket around the periphery of the baseplate. In this way, elevation of the hood provides access to all sides of the electronic equipment. Yet, when the hood is in place, a compact, aesthetically pleasing enclosure results.

In further accord with the present invention, the hood member is supported by a spring-driven lifting mechanism which automatically raises the hood above the level of the enclosed electronic equipment when the lifting mechanism is unlatched. In this way, there is no need for service personnel to exert effort to raise the hood. Since the lifting mechanism is spring-driven, it can be returned to its closed condition simply by exerting moderate pressure on the top of the hood. The latch mechanism automatically relatches when the hood is in the proper position.

In accordance with one feature of the present invention, the latching mechanism is released to an open position by a special tool to permit the lifting mechanism to operate and yet is spring-loaded so as to return to the latching position to permit automatic latching when the hood is lowered. In accordance with another feature of the invention, the lifting mechanism includes a counterweight which assists the springs when in the tightly compressed state and yet rotates on a fulcrum which removes virtually all of the assistance when the hood is in a raised condition and the springs are fully extended. In this way, only a moderate amount of force is necessary to close the hood throughout its entire range of movement despite the increasing compression on the spring.

BRIEF DESCRIPTION OF THE DRAWINGS

In the drawings:

FIG. 5 is a reduced scale sectional side elevation view of the enclosure of the present invention with the hood raised;

FIG. 6 is a partial elevation view of the spring-lifting mechanism used to raise the hood as shown in FIG. 5 of the drawings;

FIG. 7 is a detailed perspective view of the latching mechanism used for the hood shown in the other Figures of the drawings; and FIG. 8 is a cross-sectional view of the telescoping support mechanism for supporting the hood as shown in FIG. 5.

Detailed Description

Figure 1:
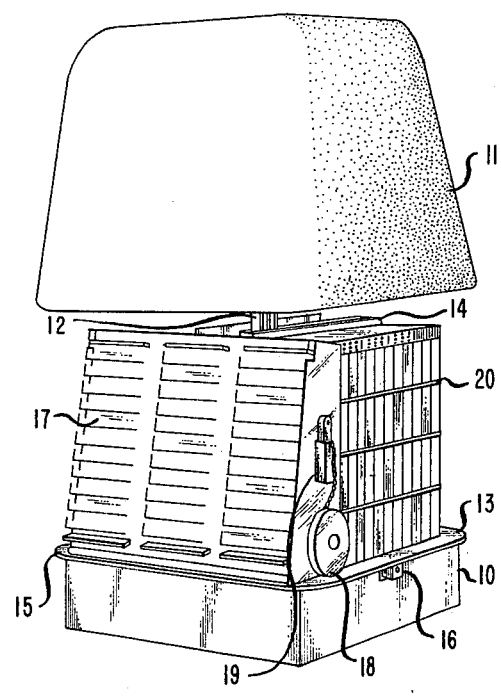
FIG. 1 is a perspective view of an electronic cabinet, in accordance with the present invention, having the hood raised.

Referring more particularly to FIG. 1, there is shown a perspective view of an electronic equipment enclosure in accordance with the present invention. The enclosure comprises a base 10 upon which is supported a mounting plate 13. A mushroom-shaped hood 11 is supported by a lifting mechanism 12 which permits hood 11 to descend so that the inner surface of hood 11 mates with a gasket 15 which extends around the entire periphery of mounting plate 13. Mounted on baseplate 13 is an H-shaped mounting frame 14 to which the lifting mechanism 12 and various electronic equipment are mounted. Thus, a cross-connect field 17 is mounted on plate 13 in front of frame 14 so as to provide easy access to the front of cross-connect field 17. A plurality of printed circuit boards 20 are mounted on each side of the enclosure and are thus accessible directly by service personnel. Printed circuit boards thus are also mounted on the opposite side of the enclosure of FIG. 1. A latch release mechanism 16 is provided to release hood 11 which, when thus released, rises to the position shown in FIG. 1. A wire supply reel 18 is mounted within the enclosure to provide a source of jumper wires for the cross-connect field 17. A wire-scraping and insertion tool 19 is also mounted within the enclosure.

It can be seen that the enclosure of FIG. 1 provides easy access to the electronic equipment and, yet when hood 11 is in the down position, provides a weatherproof and aesthetically pleasing enclosure for the equipment. Moreover, hood 11 is automatically raised to the position shown in FIG. 1 when the latch mechanism 16 is released by use of a special tool. Thus, in the position shown in FIG. 1, service personnel are able to access all sides of the electronic equipment within the enclosure without interference from hood 11. This is in comparison to standard electronic cabinets which are accessible through doors which afford only limited access to the front portions of the enclosed electronic equipment.

Figure 2:
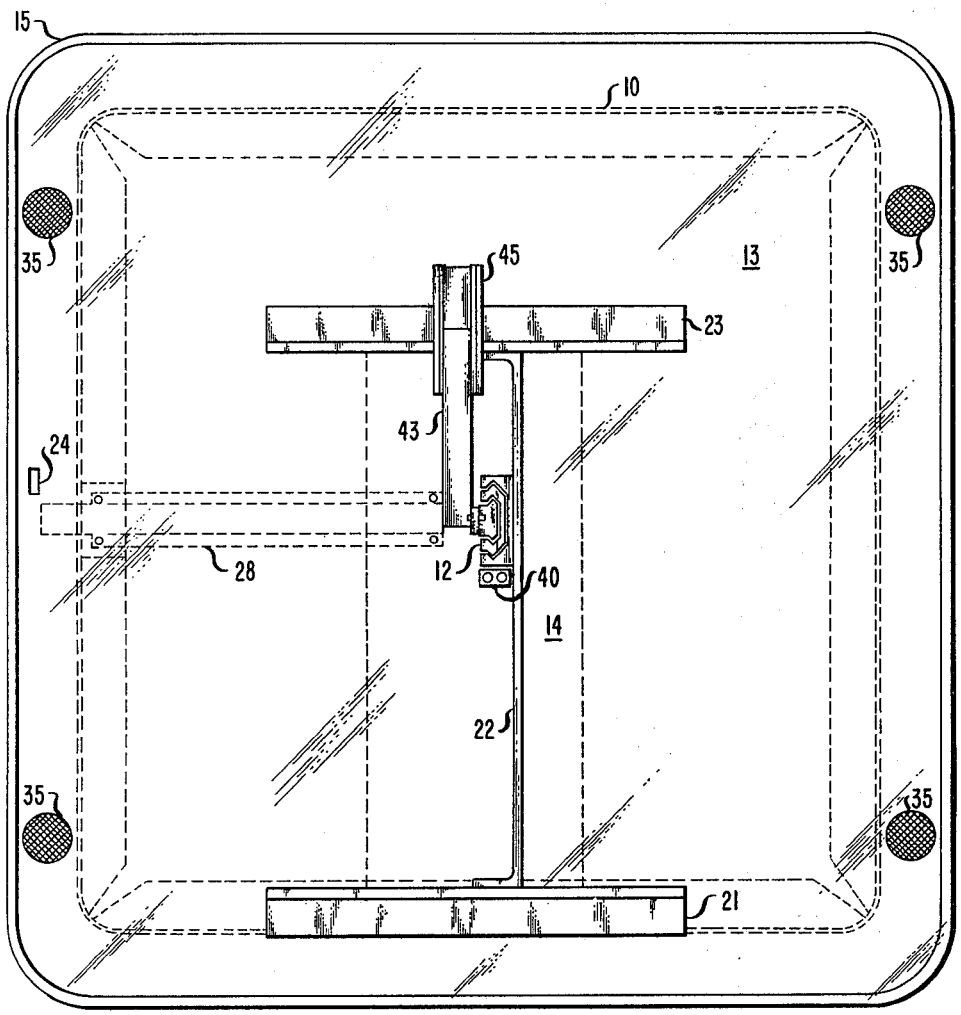
FIG. 2 is a plan view of the baseplate of the enclosure shown in FIG. 1.

In FIG. 2 there is shown a partially cutaway plan view of the enclosure of FIG. 1. The base mounting plate 13 is supported by the base 10, shown in dotted form in FIG. 2. Mounted on baseplate 13 is an H-shaped frame 14 comprising two channel-shaped end members 21 and 23 having a crossmember 22 extending therebetween. End member 23 is mounted sufficiently far away from the adjacent edge of base 13 to afford room for mounting the cross-connect field 17 (FIG. 1) in front of end member 23. Mounted to central member 22 is a telescoping support member 12 which supports the hood 11 in its open position. A spring mechanism 40 is shown in FIG. 2 in a cross-sectional view and will be described in more detail in connection with the remaining Figures.

A housing 28 is shown in FIG. 2 in dotted form and represents the housing for the latching mechanism to be described hereinafter. This housing is attached to the lower surface of baseplate 13 and extends at one end through base 10 to afford access for releasing the latch. The other end is in the vicinity of telescoping mechanism 12 to provide latching, as will be described in connection with FIG. 7.

Attached to telescoping support member 12 is a counterweight 43 which slides along and within a chute 45 affixed to end member 23. As will be described hereinafter, counterweight 43 is pivoted at support member 12 and provides a variable force assistance for raising and lowering hood 11. A plurality of ventilation holes 35 are provided in mounting plate 13 in the area between the gasket 15 and the outer edge of base 10. Holes 35 have inserted therein ventilation slits which permit air from outside the enclosure to circulate into the enclosure and remove water vapor generated therein by the cable ends coming into the enclosure through baseplate 13. Baseplate 13 includes a slot 24 for receiving a hasp mounted to hood 11 which projects through slot 24 when hood 11 is in the closed position. As will be described, this hasp includes a hole through which a padlock may be inserted to lock the enclosure in the closed position.

Figure 3:
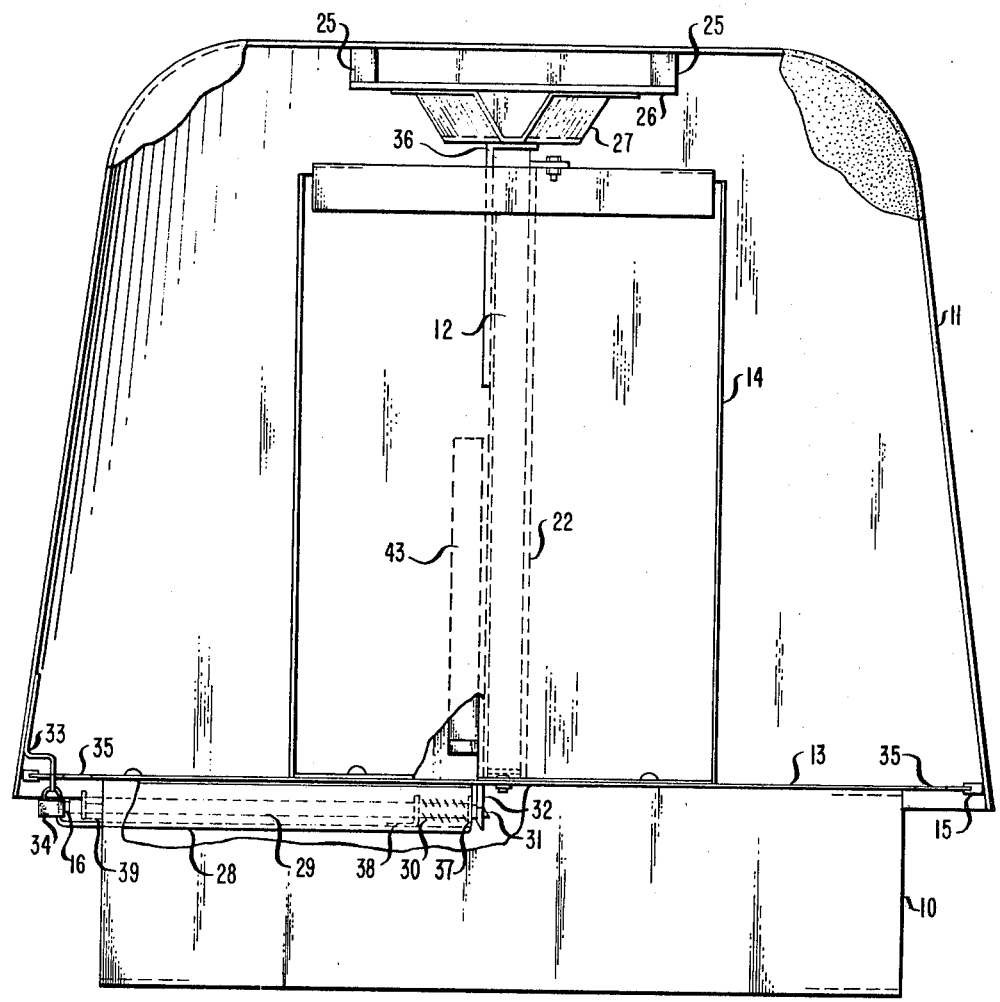
FIG. 3 is a partially cutaway front elevation of the enclosure shown in plan view in FIG. 2.

In FIG. 3 there is shown a partially cutaway front elevation of the enclosure shown in plan view in FIG. 2. Thus, mounting plate 13 is mounted in base 10. Hood 11 is shown in the closed position with a bracket 33 mounted on the inner surface thereof having the hasp portion extending below mounting plate 13 to permit locking of the hood by means of padlock 34. As can be seen in FIG. 3, standoffs 25 are used to mount an adjustment plate 26 to the inner side of the upper portion of hood 11. A cone-shaped bracket 27 is mounted to plate 26 and serves to attach L-shaped bracket 36 to hood 11. Bracket 36, in turn, is attached to the upper end of the lifting mechanism 12. Thus, standoffs 25, plate 26 and brackets 27 and 36 serve to attach the lifting mechanism 12 to hood 11.

Hood 11 may be fabricated of high impact plastic material or heavy gauge metal. Hood 11 must provide weatherproof protection for the enclosed electronics as well as sufficient rigidity and strength to withstand physical injury caused by natural events or deliberate vandalism. Attached to the bottom of mounting plate 13 and extending at one end through base 10 is a housing 28 for the latching mechanism. The latching mechanism comprises a shaft 29 having a latch release 16 at one end and a latch 31 at the other end. Shaft 29 is supported by brackets 38 and 39 within housing 28 and includes a collar 37 attached near the latch end 31 of shaft 29. Constrained between collar 37 and bracket 38 is a spring 30 which permits shaft 29 to be retracted toward housing 28. This structure can be better seen in FIG. 7.

In FIG. 7 there is shown a detailed partial perspective view of the latching mechanism shown in FIG. 3. In FIG. 7 the shaft 29 has at one end a hexagonal head 16 which is used in conjunction with hexagonal socket tool to rotate shaft 29 90 degrees in either direction. The other end of shaft 29 is shaped as a latch 31 having cutaway land portions 47 and 48. The land 47 is gradually tapered in a rounded corner to land 48. A key bar 32 has a circular cutout 49 with a slot-shaped aperture 50 accessing aperture 49 from the lower edge of key bar 32. Circular aperture 49 is sufficiently large to enclose the full diameter of shaft 29. Slot 50, on the other hand, is sufficiently narrow to pass the portion of shaft 29 between lands 47 and 48 when shaft 29 is rotated 90 degrees. However, slot 50 is not large enough to release latch 31 when in the orientation shown in FIG. 7.

In operation, key bar 32 is attached to the lower portion of the lifting mechanism 12. When hood 11 is lowered, key bar 32 is thereby forced downward until the end engages the rounded portion of land 47. Under the urging of the force generated by key bar 32 on rounded land 47, shaft 29 retracts resiliently against the force of spring 30. When key bar 32 slides past the end of latch 31, latch 31, under the urging of spring 30, returns to its original position within circular aperture 49. In this condition, key bar 32, and hence hood 11, is latched in the lowered position.

If a mating hexagonal tool is secured around hexagonal head 16 and shaft 29 is rotated 90 degrees, lands 47 and 48 are permitted to escape through slot 50, thereby releasing key bar 32 and permitting hood 11 to rise under the force of the spring-loaded lifting mechanism. It will be noted that spring 30 serves to urge shaft 29 both linearly toward key bar 32 and also rotationally toward the position shown in FIG. 7.

Figure 4:
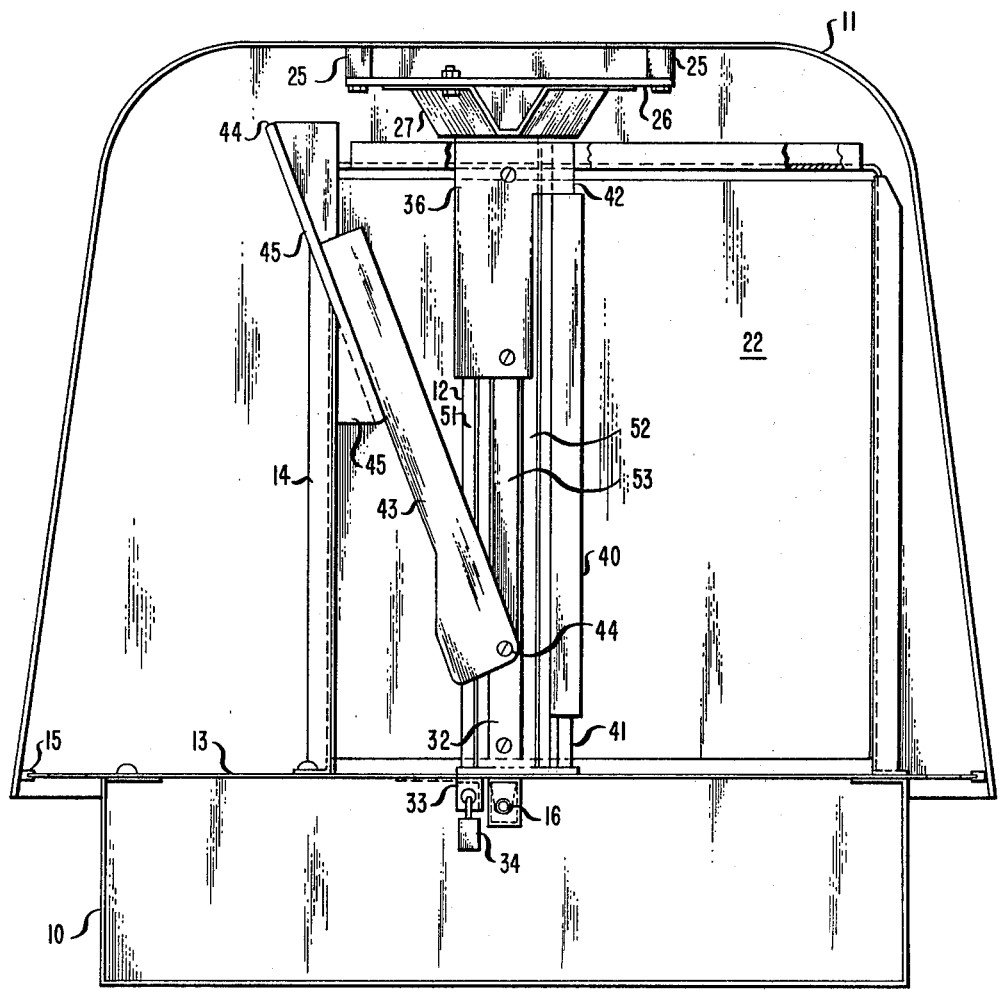
FIG. 4 is a partially cutaway side elevation of the enclosure shown in FIGS. 2 and 3.

Referring more particularly to FIG. 4, there is shown a partially cutaway side elevation view of the enclosure shown in FIG. 1. Thus, the enclosure of FIG. 4 comprises a base 10 upon which there is affixed a baseplate 13 having a gasket 15 affixed to the outer edge. The mushroom-shaped hood 11, closed in the view shown in FIG. 4, meets with gasket 15 to provide a weatherproof enclosure.

A counterweight 43 is pivotally mounted on inner channel 53 at the top of key bar 32. Cutaway 43 is arranged to slide in chute 45 when inner channel 53 is raised.

Mounted on baseplate 13 is an H-shaped frame 14 upon which are mounted various other elements of the enclosure. Thus, a telescoping lifter 12 is mounted on the crossmember 22 of H-frame 14. Telescoping member 12 has a cross section as shown in FIG. 8 comprising an outer channel 51, an intermediate channel 52 and an inner channel 53. These channels 51, 52 and 53 are separated from each other by ball bearings 54 to permit the channel units 51 through 53 to slide with respect to each other. Returning to FIG. 4, the outer channel 51 is secured to the cross-frame member 22. The L-shaped bracket 36 is affixed to the upper end of the inner channel 53 while the key bar 32 is affixed to the lower end of inner channel 53. Cone-shaped bracket 27 is affixed to L-shaped bracket 36 and adjustment plate 26 is, in turn, affixed to bracket 27. Standoffs 25 are used to secure plate 26 to the underside of hood 11. In the position shown in FIG. 4, key bar 32 extends below baseplate 13 to engage shaft 29. A spring assembly 40 includes spring elements to be described hereinafter which, in the position shown in FIG. 4, are fully compressed. When the latch mechanism is released, spring assembly 40 exerts a force on bracket 36 to raise hood 11 to the position shown in FIG. 5.

In FIG. 5 there is shown a sectional view of the enclosure of FIG. 1 with hood 11 in the raised position. In this position, spring assembly 40 is fully extended and channel members 51, 52 and 53 have translated with respect to each other to the position shown in FIG. 5. At the same time, the counterweight 43 has risen to the level of pivot point 44 and, in this position, counterweight 43 is partially balanced on pivot 44. It can thus be seen that the weight of counterweight 43 assists spring assembly 40 when hood 11 is near the closed position but is almost entirely balanced on pivot 44 when hood 11 is in the raised position shown in FIG. 5. Counterweight 43 thus provides its greatest assistance in closing hood 11 when hood 11 is nearest to the closed position. This variable assistance compensates for the increasing stiffness of spring assembly 40 as it moves toward its fully compressed position. Spring assembly 40 can be better seen in FIG. 6.

In FIG. 6 the spring assembly 40 is shown in section and can be seen to comprise a housing 40 including two compressed air cylinders 42 and 55 having piston rods 56 and 41, respectively. As can be seen in FIGS. 5 and 6, cylinder 42 is attached to the L-shaped bracket 36 while piston rod 41 bears against baseplate 13. Cylinder 55 is attached at its upper end to housing 40, while piston rod 56 is attached at its lower end to housing 40. The compressed air springs operate by having the compressed air act against the piston end in the cylinder.

It can be seen that the enclosure of the present invention not only provides an aesthetically pleasing structure but also permits full access to all sides of the enclosure with the hood in the raised position. The hood rises automatically under the urging of the springs and automatically relatches when lowered. The counterweight insures that only moderate force is needed to lower the hood and compress the springs throughout their entire range of travel.

I claim:

1. A weatherproof enclosure comprising
   a base,
   a gasket extending around the periphery of said base,
   a mushroom-shaped hood,
   centrally located means for raising and lowering said hood to expose the surface of said base when raised and to mate with said gasket when lowered,
   a spring-loaded lifting mechanism extending between said base and said hood,
   a counterweight pivotally mounted to said lifting mechanism, and
   a fulcrum for counterbalancing said counterweight when said hood is in the raised position.

2. The weatherproof enclosure of claim 1 further comprising
   a latching mechanism for said hood,
   means for releasing said latching mechanism, and
   means for latching said latching mechanism automatically when said hood is lowered.

3. A weatherproof enclosure for electronic equipment comprising
   a base member for mounting electronic equipment,
   a cover member for forming a weatherproof seal with said base member,
   a centrally located lifting mechanism for raising the entire said cover member to expose all sides of said electronic equipment,
   a latching mechanism to selectively hold said cover member in a closed position, and
   a spring member for operating said lifting mechanism when said latching mechanism releases said cover member.

4. The weatherproof enclosure of claim 3 wherein said latching mechanism comprises
   a spring-loaded latchbar keyed at one end so as to release said cover member when rotated and shaped at said one end so as to latch to said cover member when laterally displaced.

5. The weatherproof enclosure of claim 3 wherein said spring member comprises two staged gas springs.

* * * * *